(12) United States Patent
Huang et al.

(10) Patent No.: US 7,264,743 B2
(45) Date of Patent: Sep. 4, 2007

(54) FIN STRUCTURE FORMATION

(75) Inventors: Zhi-Song Huang, Fremont, CA (US); S. M. Reza Sadjadi, Saratoga, CA (US)

(73) Assignee: Lam Research Corporation, Fremont, CA (US)

( * ) Notice: Subject to any disclaimer, the term of this patent is extended or adjusted under 35 U.S.C. 154(b) by 23 days.

(21) Appl. No.: 11/338,464

(22) Filed: Jan. 23, 2006

(65) Prior Publication Data

US 2007/0170146 A1 Jul. 26, 2007

(51) Int. Cl.
*C03C 25/68* (2006.01)

(52) U.S. Cl. .................... 216/67; 438/153; 438/154; 438/396; 438/584; 257/350; 257/351; 257/401; 257/284; 257/413

(58) Field of Classification Search .................. 216/67; 438/584; 257/350
See application file for complete search history.

(56) References Cited

U.S. PATENT DOCUMENTS

| 5,716,884 A * | 2/1998 | Hsue et al. ................. 438/254 |
| 2001/0034114 A1* | 10/2001 | Liaw .......................... 438/584 |
| 2006/0022262 A1* | 2/2006 | Yoon et al. ................. 257/328 |

* cited by examiner

*Primary Examiner*—Lan Vinh
*Assistant Examiner*—Maki Angadi
(74) *Attorney, Agent, or Firm*—Beyer Weaver LLP

(57) ABSTRACT

A method for forming fin structures is provided. Sacrificial structures are provided on a substrate. Fin structures are formed on the sides of the sacrificial structures. The forming of the fin structures comprises a plurality of cycles, wherein each cycle comprises a fin deposition phase and a fin profile shaping phase. The sacrificial structure is removed.

19 Claims, 8 Drawing Sheets

FIN STRUCTURE FORMATION

BACKGROUND OF THE INVENTION

The present invention relates to the formation of semiconductor devices. More particularly, the invention relates to the formation of semiconductor devices with fin structures.

In a semiconductor-based device (e.g., integrated circuits or flat panel displays), fin structures may be used in various devices. For example, a finFET is a MOSFET built on a SOI substrate on which silicon is etched into a fin shaped body of the transistor. A gate is wrapped around and over the fin structure.

Spacer lithography may be one way of creating fins. In one way of doing this, a sacrificial layer is provided and then etched to form sacrificial structures. A conformal CVD is then used to form a conformal layer over and around the sacrificial structures. An etch back is used to etch the horizontal layers of the conformal layer. The sacrificial structure is then removed to form fin structures. The thickness of the fins may be 10 nm or less. To provide a desired conformal layer, the conventional CVD deposition may require a high temperature CVD. Such high temperatures may be detrimental to the semiconductor device. The high temperature may cause a process to go beyond a device thermal budget. In addition, if doping has previously been done, the high temperature may be detrimental to the doped areas.

In addition, such CVD fin processes are limited with regards to the sacrificial layer and fin. Generally, a sacrificial layer of silicon oxide would provide a fin of silicon nitride. A sacrificial layer of silicon nitride would provide a sacrificial layer of silicon oxide.

Furthermore, forming fin structures with conformal CVD processes places very stringent requirements on the profile of the sacrificial structures. The profile angle would need to be very close to vertical. A slight deviation from vertical profile would cause the fin structure to tilt, causing potential defect problems and CD variations.

SUMMARY OF THE INVENTION

To achieve the foregoing and in accordance with the purpose of the present invention, a method for forming fin structures is provided. Sacrificial structures are provided on a substrate. Fin structures are formed on the sides of the sacrificial structures. The forming of the fin structures comprises a plurality of cycles, wherein each cycle comprises a fin deposition phase and a fin profile shaping phase. The sacrificial structure is removed.

In another manifestation of the invention, a method for forming a plurality of vertical fins on a substrate is provided. Sacrificial structures are provided on the substrate. Fin structures are formed on the sides of the sacrificial structures, comprising a plurality of cycles. Each cycle comprises a fin deposition phase, which deposits a fin material, and a fin profile shaping phase, which shapes the profile of the deposited fin material. The fin deposition phase comprises providing a deposition gas, forming a plasma from the deposition gas, depositing deposition material to form fins, and stopping the flow of the deposition gas. The fin profile shaping phase comprises providing a profile shaping gas different than the deposition gas, forming a plasma from the profile shaping gas, shaping the profile of the deposited deposition material, and stopping the flow of the profile shaping gas. The sacrificial structure is removed.

In another manifestation of the invention, an apparatus for forming fin structures is provided. A plasma processing chamber comprising a chamber wall forming a plasma processing chamber enclosure, a substrate support for supporting a substrate within the plasma processing chamber enclosure, a pressure regulator for regulating the pressure in the plasma processing chamber enclosure, at least one electrode for providing power to the plasma processing chamber enclosure for sustaining a plasma, a gas inlet for providing gas into the plasma processing chamber enclosure, and a gas outlet for exhausting gas from the plasma processing chamber enclosure is provided. A gas source is in fluid connection with the gas inlet. The gas source comprises a sacrificial layer etchant source, a fin deposition gas source, and a fin profile shaping gas source. A controller is controllably connected to the gas source and the at least one electrode. The controller comprises at least one processor and computer readable media. The computer readable media comprises computer readable code for providing sacrificial structures on the substrate, computer readable code for forming fin structures on the sides of the sacrificial structures, comprising a plurality of cycles, and computer readable code for removing the sacrificial structure. The computer readable code for forming fin structures comprises computer readable code for providing a plurality of cycles, wherein each cycle comprises a fin deposition phase which deposits a fin material, comprising computer readable code for providing a deposition gas, computer readable code for forming a plasma from the deposition gas, computer readable code for depositing deposition material to form fins, and computer readable code for stopping the flow of the deposition gas, and a fin profile shaping phase which shapes the profile of the deposited fin material, comprising computer readable code for providing a profile shaping gas different than the deposition gas, computer readable code for forming a plasma from the profile shaping gas, computer readable code for shaping the profile of the deposited deposition material, and computer readable code for stopping the flow of the profile shaping gas.

These and other features of the present invention will be described in more detail below in the detailed description of the invention and in conjunction with the following figures.

BRIEF DESCRIPTION OF THE DRAWINGS

The present invention is illustrated by way of example, and not by way of limitation, in the figures of the accompanying drawings and in which like reference numerals refer to similar elements and in which.

DETAILED DESCRIPTION OF THE PREFERRED EMBODIMENTS

The present invention will now be described in detail with reference to a few preferred embodiments thereof as illustrated in the accompanying drawings. In the following description, numerous specific details are set forth in order to provide a thorough understanding of the present invention. It will be apparent, however, to one skilled in the art, that the present invention may be practiced without some or all of these specific details. In other instances, well known process steps and/or structures have not been described in detail in order to not unnecessarily obscure the present invention.

Figure 1:
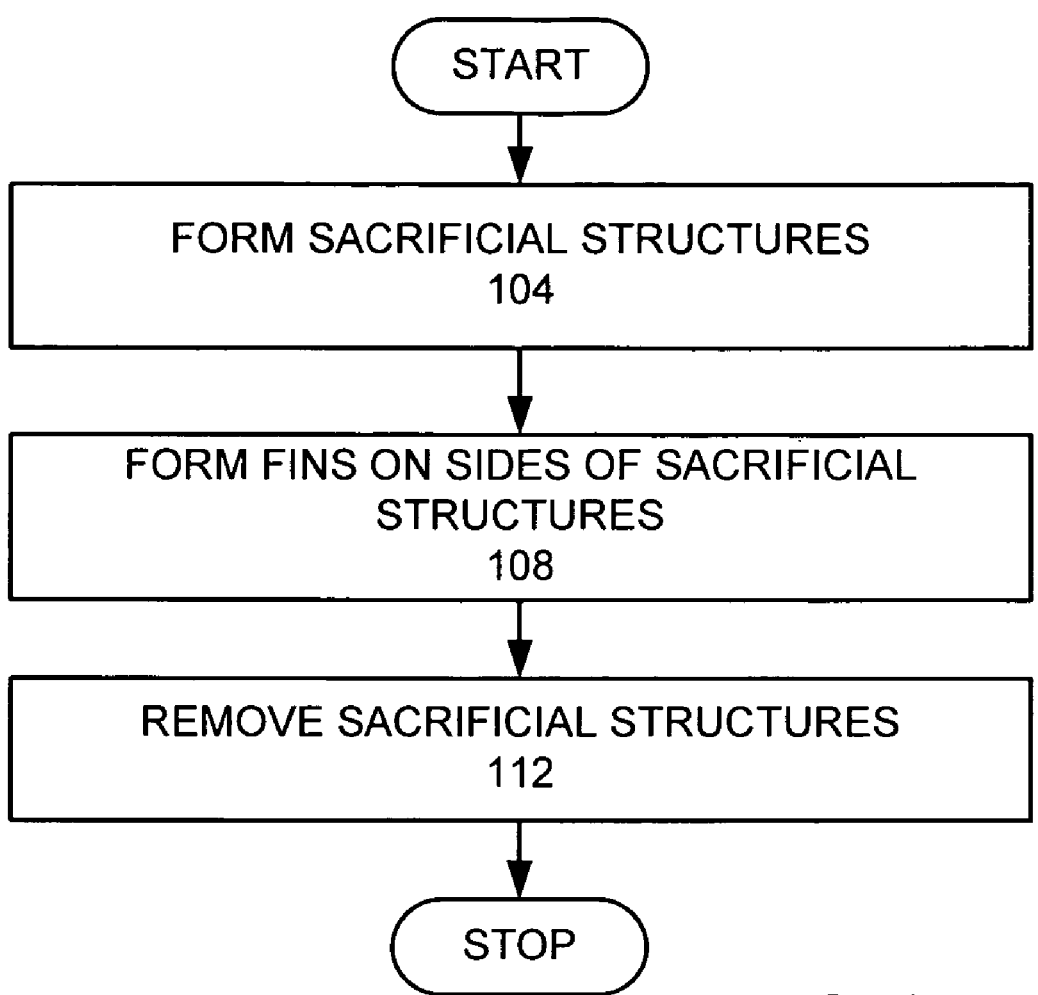
FIG. 1 is a high level flow chart of a process that may be used in an embodiment of the invention.
Figure 6:
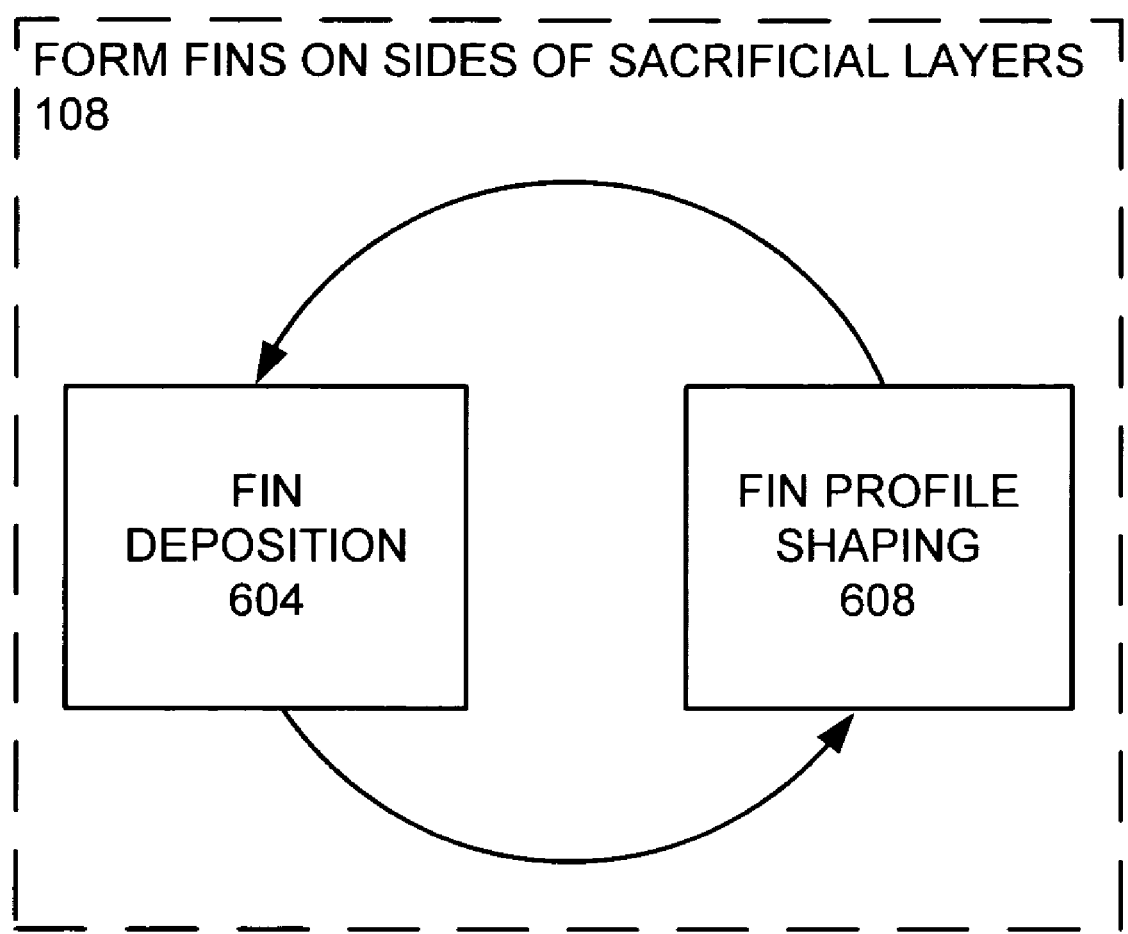
FIG. 6 is a more detailed flow of a step of fin formation.

To facilitate understanding, FIG. 1 is a high level flow chart of a process that may be used in an embodiment of the invention. Sacrificial structures are formed (step 104). Fins are formed on the side of the sacrificial structures (step 108). FIG. 6 is a more detailed flow chart of the forming fins on the side of the sacrificial structures, which comprises a plurality of cycles, wherein each cycle comprises a fin deposition phase (step 604) and a fin profile shaping phase (step 608). The sacrificial structures are removed (step 112).

EXAMPLE 1

Figure 2:
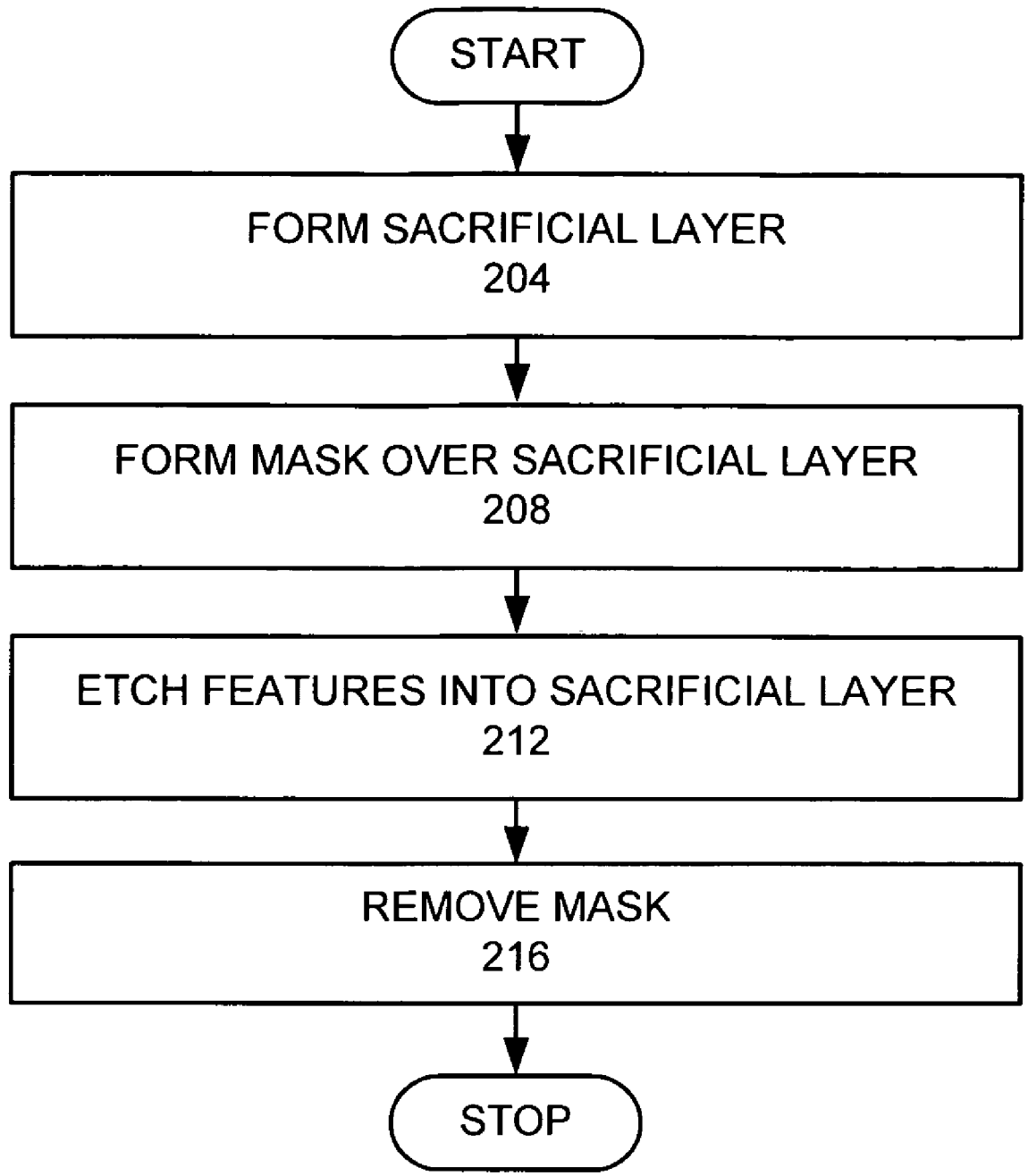
FIG. 2 is a more detailed flow chart of the forming sacrificial structures.
Figure 3A:
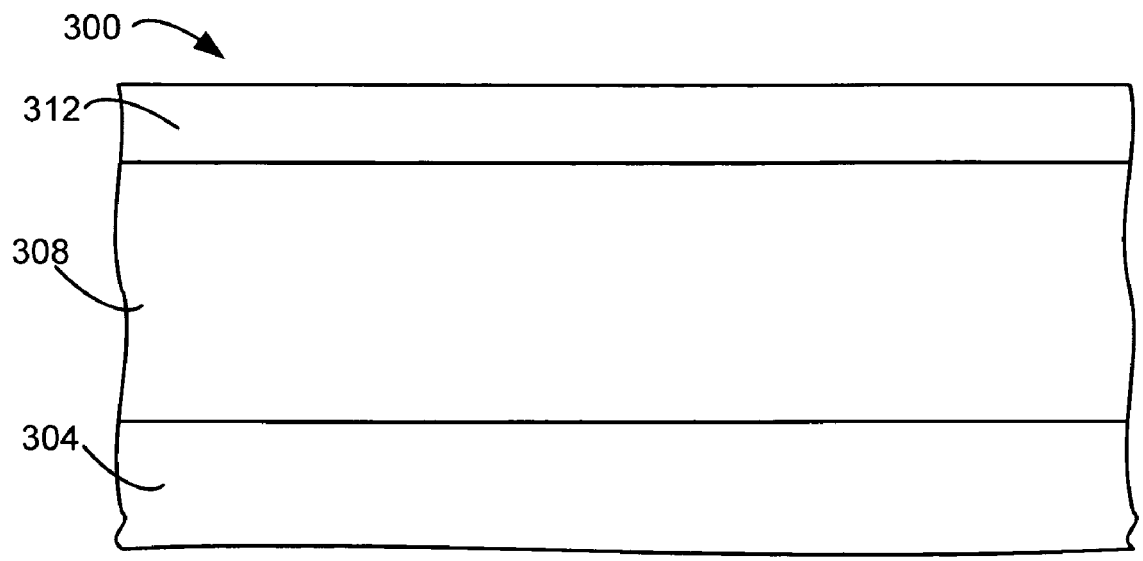
FIGS. 3A-F are schematic cross-sectional and top views of a stack processed according to an embodiment of the invention.

In an example of an embodiment of the invention, the sacrificial structures are formed (step 104). FIG. 2 is a more detailed flow chart of the formation of the sacrificial structures. A sacrificial layer is formed (step 204). FIG. 3A is a cross-sectional view of a stack 300 with a sacrificial layer 312 formed over a substrate 304. One or more layers such as an intermediate layer 308 may be between the sacrificial layer 312 and the substrate 304. In this example, the substrate 304 is a silicon wafer. The sacrificial layer may be of a wide assortment of materials such as silicon nitride (SiN), photoresist, silicon oxide ($SiO_2$), amorphous carbon, silicon, or organic material. The sacrificial layer is silicon carbide. In other embodiments, the sacrificial layer is at least one of SiC, SiN, SiOC, H doped SiOC, TiN, TaN, Ti, Ta, Si, and SiO2. More generally, the sacrificial layer is of any material, which may be selectively etched with respect to a fin material and any underlying layer.

Figure 3B:
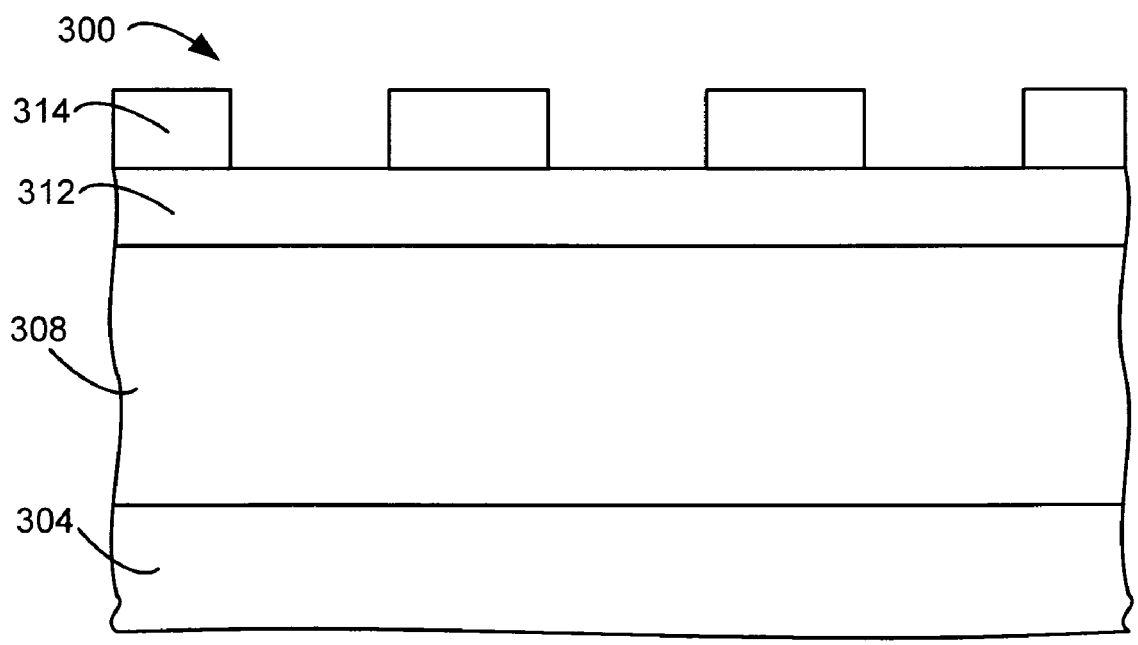
Figure 3C:
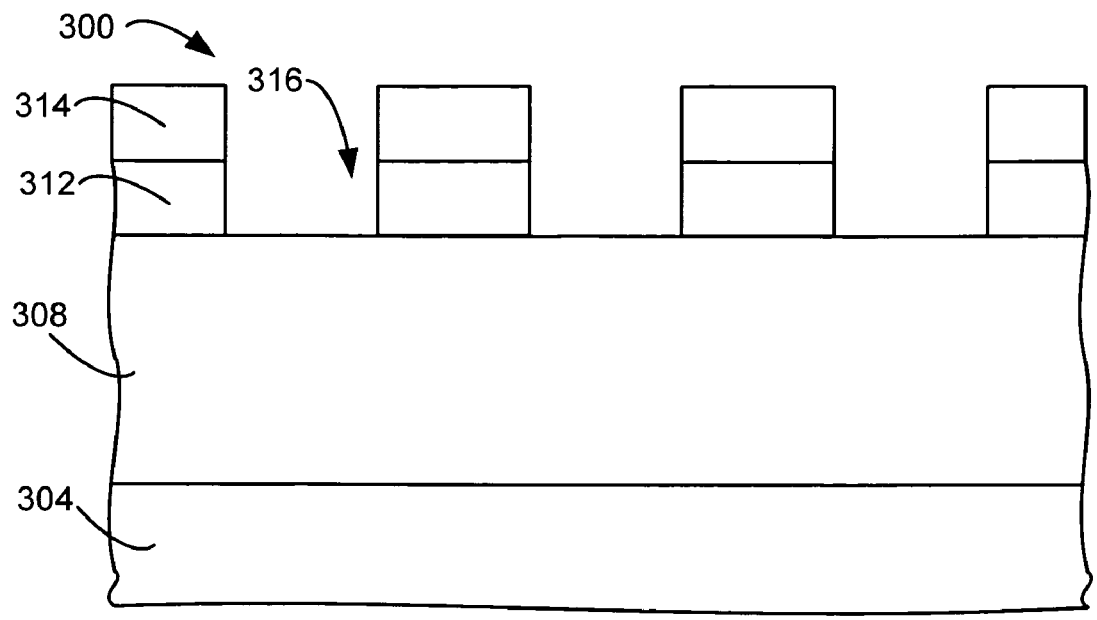
Figure 3D:
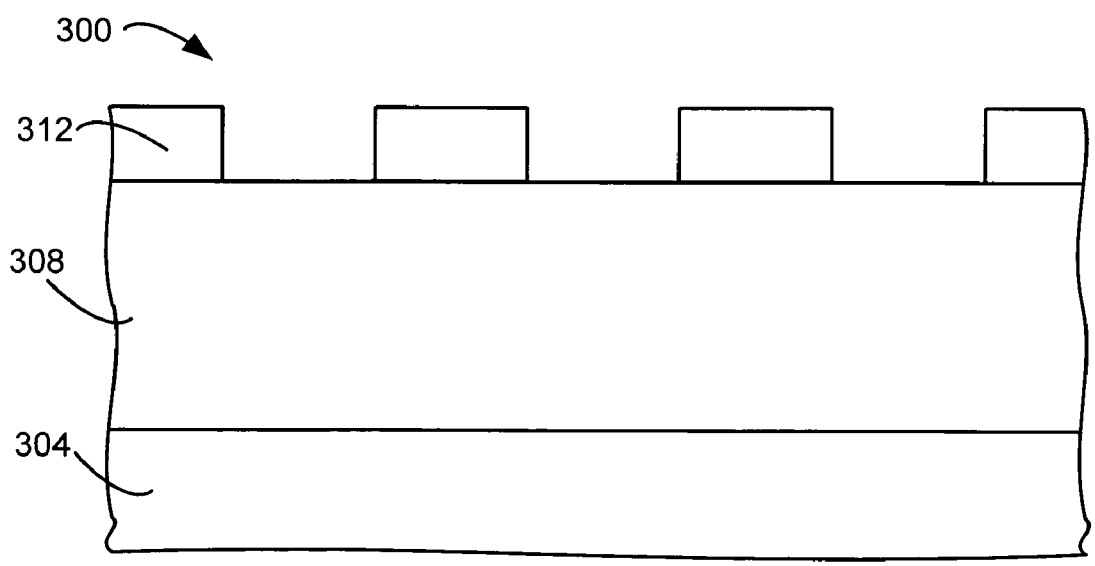

A mask 314 is formed over the sacrificial layer 312 (step 208), as shown in FIG. 3B. Features 316 are etched into the sacrificial layer 312 (step 212), as shown in FIG. 3C. After etching features in the sacrificial layer, the mask 314 is removed (step 216), as shown in FIG. 3D. It is preferred that the feature sides have a slightly re-entrant profile so that the etched features are wider at the bottom than at the top to give the resulting fin structure a slightly tapered profile. Preferably, the etched features 316 have sides with a profile angle that is 89 to 95 degrees. Most preferably, the profile angle of the sides of the etched features ranges from 90 to 93 degrees.

Figure 3E:
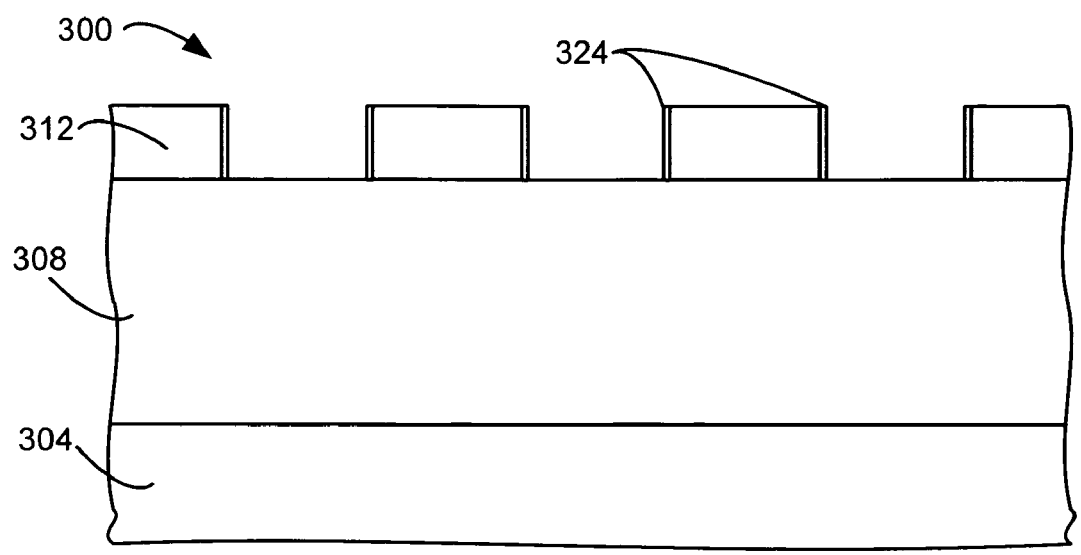

Fins 324 are formed on the sides of the sacrificial structures formed by the remaining sacrificial layer 312 (step 108), as shown in FIG. 3E.

Figure 4:
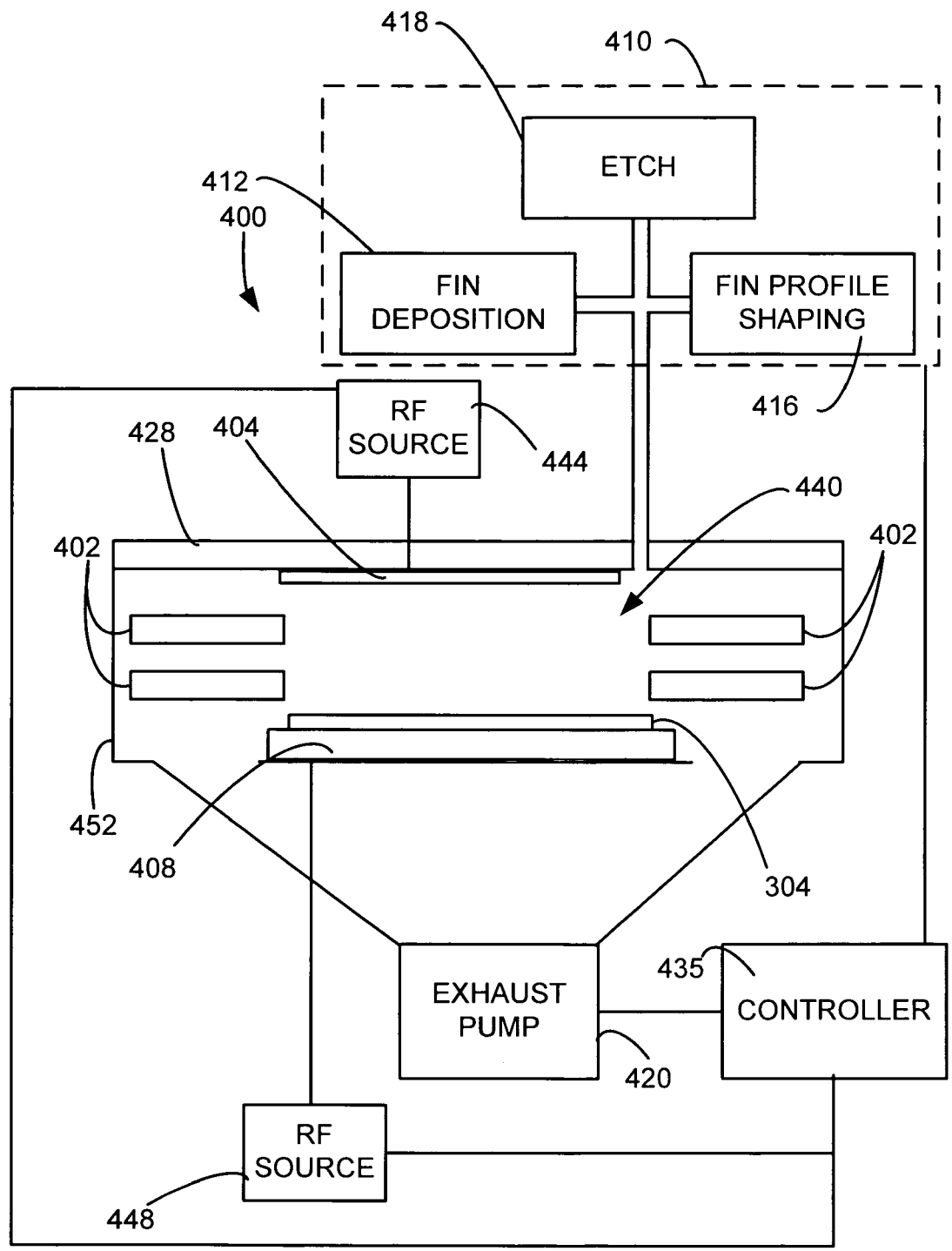
FIG. 4 is a schematic view of a plasma processing chamber that may be used in practicing the invention.

FIG. 4 is a schematic view of a processing chamber 400 that may be used to form the fins. The plasma processing chamber 400 comprises confinement rings 402, an upper electrode 404, a lower electrode 408, a gas source 410, and an exhaust pump 420. The gas source 410 comprises a fin deposition gas source 412 and a fin profile shaping gas source 416. The gas source may comprise additional gas sources such as an etch gas source 418 to allow etching of the sacrificial layer to be done in situ in the same chamber. Within plasma processing chamber 400, the substrate 304 is positioned upon the lower electrode 408. The lower electrode 408 incorporates a suitable substrate chucking mechanism (e.g., electrostatic, mechanical clamping, or the like) for holding the substrate 304. The reactor top 428 incorporates the upper electrode 404 disposed immediately opposite the lower electrode 408. The upper electrode 404, lower electrode 408, and confinement rings 402 define the confined plasma volume 440. Gas is supplied to the confined plasma volume by the gas source 410 and is exhausted from the confined plasma volume through the confinement rings 402 and an exhaust port by the exhaust pump 420. A first RF source 444 is electrically connected to the upper electrode 404. A second RF source 448 is electrically connected to the lower electrode 408. Chamber walls 452 surround the confinement rings 402, the upper electrode 404, and the lower electrode 408. Both the first RF source 444 and the second RF source 448 may comprise a 27 MHz power source and a 2 MHz power source. Different combinations of connecting RF power to the electrode are possible. In the case of Lam Research Corporation's Dual Frequency Capacitive (DFC) System, made by LAM Research Corporation™ of Fremont, Calif., which may be used in a preferred embodiment of the invention, both the 27 MHz and 2 MHz power sources make up the second RF power source 448 connected to the lower electrode, and the upper electrode is grounded. In other embodiments, the RF power source may have a frequency up to 300 MHz. A controller 435 is controllably connected to the RF sources 444, 448, exhaust pump 420, and the gas source 410.

Figure 5A:
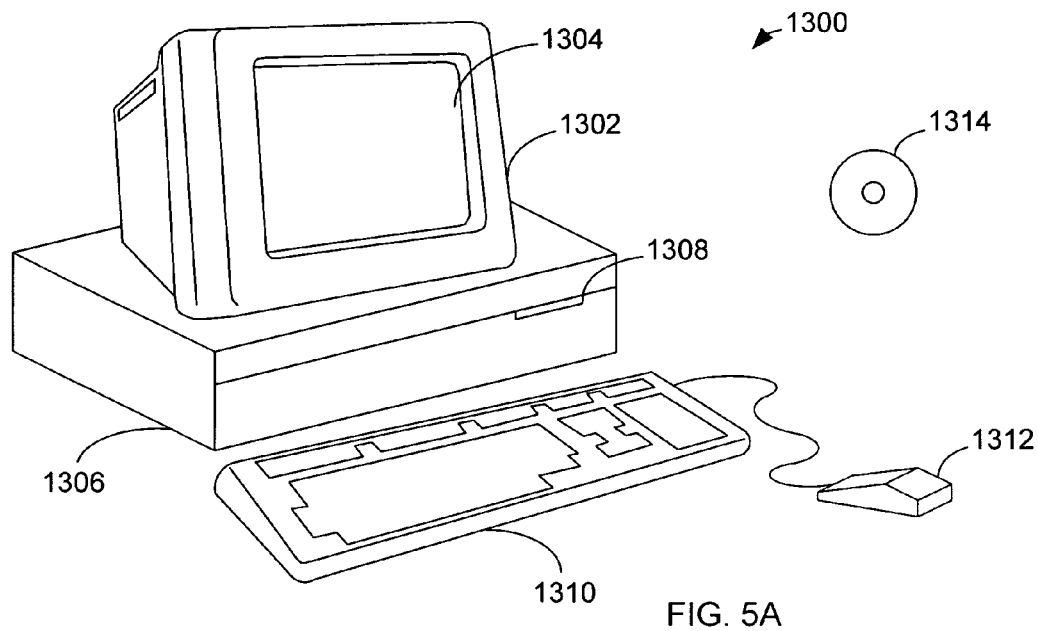
FIGS. 5A-B illustrate a computer system, which is suitable for implementing a controller used in embodiments of the present invention.
Figure 5B:
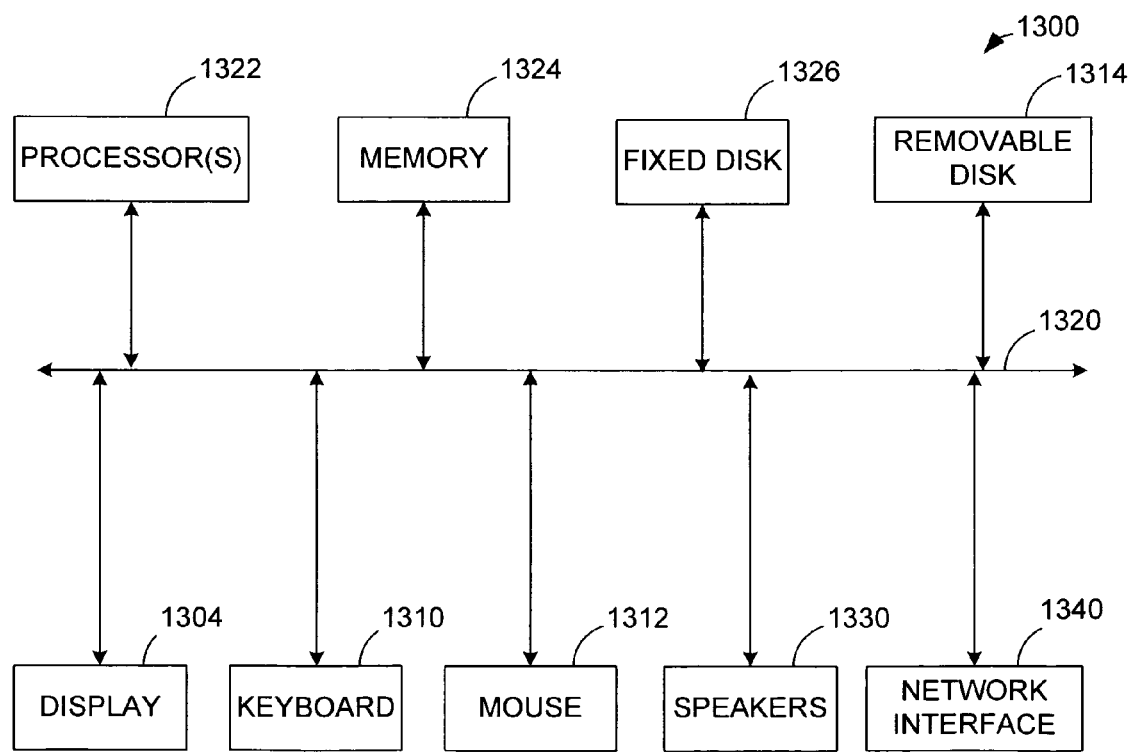

FIGS. 5A and 5B illustrate a computer system 1300, which is suitable for implementing a controller 435 used in embodiments of the present invention. FIG. 5A shows one possible physical form of the computer system. Of course, the computer system may have many physical forms ranging from an integrated circuit, a printed circuit board, and a small handheld device up to a huge super computer. Computer system 1300 includes a monitor 1302, a display 1304, a housing 1306, a disk drive 1308, a keyboard 1310, and a mouse 1312. Disk 1314 is a computer-readable medium used to transfer data to and from computer system 1300.

FIG. 5B is an example of a block diagram for computer system 1300. Attached to system bus 1320 is a wide variety of subsystems. Processor(s) 1322 (also referred to as central processing units, or CPUs) are coupled to storage devices, including memory 1324. Memory 1324 includes random access memory (RAM) and read-only memory (ROM). As is well known in the art, ROM acts to transfer data and instructions uni-directionally to the CPU and RAM is used typically to transfer data and instructions in a bi-directional manner. Both of these types of memories may include any suitable of the computer-readable media described below. A fixed disk 1326 is also coupled bi-directionally to CPU 1322; it provides additional data storage capacity and may also include any of the computer-readable media described below. Fixed disk 1326 may be used to store programs, data, and the like and is typically a secondary storage medium (such as a hard disk) that is slower than primary storage. It will be appreciated that the information retained within fixed disk 1326 may, in appropriate cases, be incorporated in standard fashion as virtual memory in memory 1324. Removable disk 1314 may take the form of any of the computer-readable media described below.

CPU 1322 is also coupled to a variety of input/output devices, such as display 1304, keyboard 1310, mouse 1312, and speakers 1330. In general, an input/output device may be any of: video displays, track balls, mice, keyboards, microphones, touch-sensitive displays, transducer card readers, magnetic or paper tape readers, tablets, styluses, voice or handwriting recognizers, biometrics readers, or other computers. CPU 1322 optionally may be coupled to another computer or telecommunications network using network interface 1340. With such a network interface, it is contemplated that the CPU might receive information from the network, or might output information to the network in the course of performing the above-described method steps. Furthermore, method embodiments of the present invention may execute solely upon CPU 1322 or may execute over a network such as the Internet in conjunction with a remote CPU that shares a portion of the processing.

In addition, embodiments of the present invention further relate to computer storage products with a computer-readable medium that have computer code thereon for performing various computer-implemented operations. The media and computer code may be those specially designed and constructed for the purposes of the present invention, or they may be of the kind well known and available to those having skill in the computer software arts. Examples of computer-readable media include, but are not limited to: magnetic media such as hard disks, floppy disks, and magnetic tape; optical media such as CD-ROMs and holographic devices; magneto-optical media such as floptical disks; and hardware devices that are specially configured to store and execute program code, such as application-specific integrated circuits (ASICs), programmable logic devices (PLDs) and ROM and RAM devices. Examples of computer code include machine code, such as produced by a compiler, and files containing higher level code that are executed by a computer using an interpreter. Computer readable media may also be computer code transmitted by a computer data signal embodied in a carrier wave and representing a sequence of instructions that are executable by a processor.

FIG. 6 is a more detailed flow chart of the forming fins on the side of the sacrificial structures, which comprises a plurality of cycles, wherein each cycle comprises a fin deposition phase (step 604) and a fin profile shaping phase (step 608).

Preferably, the fin deposition phase (step 604) uses a deposition gas comprising at least one of a combination of $CF_4$ and $H_2$ or a combination of $CH_3F$ and $N_2$ or $C_xF_y$ or $C_xH_yF_z$ or $C_xH_y$ with an oxidizing or reducing additive such as hydrogen, nitrogen, or oxygen, and carrier gases such as He, Ar, Ne, Kr, Xe etc. More generally, the deposition gas comprises at least one of hydrocarbon, fluorocarbon, and hydrofluorocarbon, silane or any Si-containing gases. More preferably, the deposition gas further comprises a carrier gas, such as argon or xenon. More preferably, the deposition gas further comprises at least one of an oxidizing additive and a reducing additive, such as $O_2$, $H_2$, or $NH_3$.

An example of a fin deposition phase (step 604) provides a flow of 150 sccm $CH_3F$, 75 sccm $N_2$, and 100 sccm Ar. The pressure is set to 80 mTorr. The substrate is maintained at a temperature of 20° C. The second RF source 448 provides 400 Watts at a frequency of 27 MHz and 0 Watts a frequency of 2 MHz. During the deposition phase the deposition gas is provided, the deposition gas is transformed into a plasma, and then the deposition gas is stopped.

Preferably, the fin profile shaping stage uses a profile shaping gas comprising at least one of $C_xF_y$ and $NF_3$ and $C_xH_y$ and $C_xH_yF_z$. More preferably, the profile shaping gas further comprises a carrier gas, such as argon or xenon. More preferably, the profile shaping gas further comprises at least one of an oxidizing additive and a reducing additive, such as $O_2$, $H_2$, or $NH_3$. As a result, the profile shaping gas is different than the deposition gas.

An example of the fin profile shaping phase (step 608) provides a halogen (i.e. fluorine, bromine, chlorine) containing hydrocarbon gas, such as 100 sccm $CF_4$. In this example, $CF_4$ is the only gas provided during the profile shaping. A pressure of 20 mTorr is provided to the chamber. The second RF source 448 provides 600 Watts at a frequency of 27 MHz and 0 Watts a frequency of 2 MHz. During the profile shaping phase the profile shaping gas is provided, the profile shaping gas is transformed into a plasma, and then the profile shaping gas is stopped.

Preferably, the process is performed for between 2 to 20 cycles. More preferably, the process is performed between 3 to 10 cycles. The combination of deposition and profile shaping over a plurality of cycles allows for the formation of vertical sidewalls for the fins. Preferably, the vertical sidewalls are sidewalls that from bottom to top make an angle between 87° to 93° with the bottom of the fins. When combined with a slightly re-entrant profile on the sacrificial structures, a symmetrically slightly tapered fin structure is formed.

The cyclical cycle may have additional deposition and/or shaping phases or may have other additional phases for the formation of the fins.

Figure 3F:
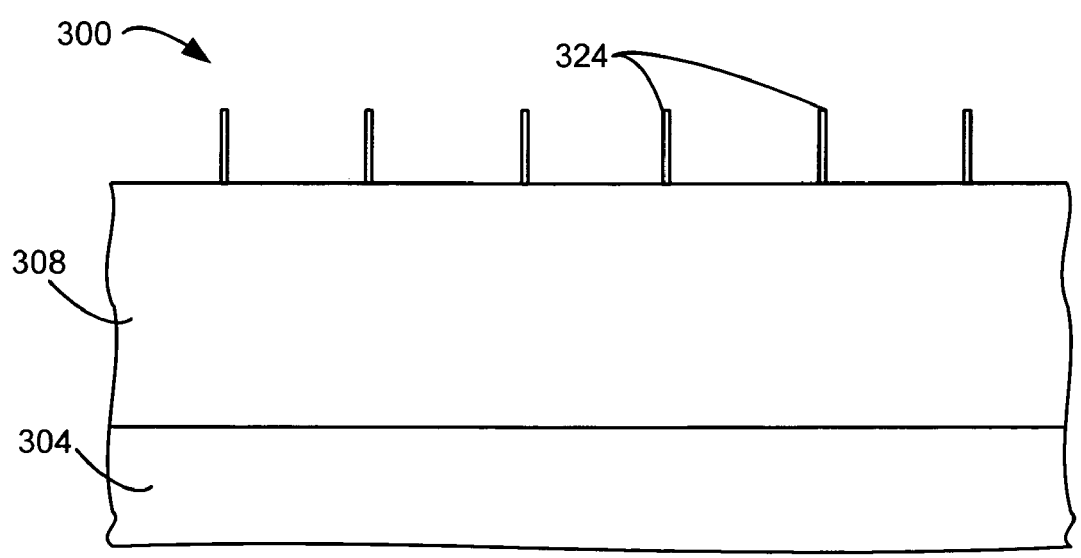

The sacrificial structures are then removed (step 112), leaving the remaining fins 324 as shown in FIG. 3F.

EXAMPLE 2

In another example, the formation of a sacrificial structures 104, a photoresist mask itself may be used as a sacrificial structure, so that an additional sacrificial layer is not used.

In both examples, additional conventional processing steps are provided to form finFETs out of the fins.

The inventive process provides fins of various materials such as amorphous carbon, amorphous silicon, silicon oxide, and silicon nitride.

While this invention has been described in terms of several preferred embodiments, there are alterations, modifications, permutations, and various substitute equivalents, which fall within the scope of this invention. It should also be noted that there are many alternative ways of implementing the methods and apparatuses of the present invention. It is therefore intended that the following appended claims be interpreted as including all such alterations, modifications, permutations, and various substitute equivalents as fall within the true spirit and scope of the present invention.

What is claimed is:

1. A method, comprising:
    providing sacrificial structures on a substrate;
    forming fin structures on sides of the sacrificial structures, comprising a plurality of cycles, wherein each cycle comprises:
        a fin deposition phase; and
        a fin profile shaping phase; and
    removing the sacrificial structure.

2. The method, as recited in claim 1, wherein the fin deposition phase comprises:
    providing a deposition gas;
    forming a plasma from the deposition gas;
    depositing a deposition material from the plasma to form fins; and
    stopping the flow of the deposition gas.

3. The method, as recited in claim 2, wherein the fin profile shaping phase comprises:
    providing a profile shaping gas different than the deposition gas;

forming a plasma from the profile shaping gas;
shaping profiles of the deposited deposition material; and
stopping the flow of the profile shaping gas.

4. The method, as recited in claim 3, wherein the deposition gas comprises at least one of a hydrocarbon, fluorocarbon, hydrofluorocarbon, silane, and a Si-containing gases and the profile shaping gas comprises at least one of $C_xF_y$, $NF_3$, $C_xH_y$ and $C_xH_yF_z$.

5. The method, as recited in claim 4, wherein the fin structures have vertical sidewalls.

6. The method, as recited in claim 5, wherein the providing sacrificial structures comprises forming a photoresist mask over the substrate, wherein the photoresist mask forms the sacrificial structures.

7. The method, as recited in claim 5, wherein the providing sacrificial structures comprises:
forming a sacrificial layer over the substrate,
forming a mask over the substrate;
etching features into the sacrificial layer through the mask; and
removing the mask.

8. The method, as recited in claim 7, wherein the mask is a photoresist mask.

9. The method, as recited in claim 1, wherein the fin structures have vertical sidewalls.

10. The method, as recited in claim 1, wherein the providing sacrificial structures comprises forming a photoresist mask over the substrate, wherein the photoresist mask forms the sacrificial structures.

11. The method, as recited in claim 1, wherein the providing sacrificial structures comprises:
forming a sacrificial layer over the substrate,
forming a mask over the substrate;
etching features into the sacrificial layer through the mask; and
removing the mask.

12. The method, as recited in claim 11, wherein the mask is a photoresist mask.

13. A device formed by the method of claim 1.

14. A method for forming a plurality of vertical fins on a substrate, comprising:
providing sacrificial structures on the substrate;
forming fin structures on sides of the sacrificial structures, comprising a plurality of cycles, wherein each cycle comprises:
a fin deposition phase which deposits a fin material, comprising:
providing a deposition gas;
forming a plasma from the deposition gas;
depositing deposition material to form fins; and
stopping the flow of the deposition gas; and
a fin profile shaping phase which shapes the profile of the deposited fin material, comprising:
providing a profile shaping gas different than the deposition gas;
forming a plasma from the profile shaping gas;
shaping the profile of the deposited deposition material; and
stopping the flow of the profile shaping gas; and
removing the sacrificial structure.

15. The method, as recited in claim 14, wherein the deposition gas comprises at least one of a hydrocarbon, fluorocarbon, hydrofluorocarbon, silane, and a Si-containing gases and the profile shaping gas comprises at least one of $C_xF_y$, $NF_3$, $C_xH_y$ and $C_xH_yF_z$.

16. The method, as recited in claim 14, wherein the fin structures have vertical sidewalls.

17. The method, as recited in claim 14, wherein the providing sacrificial structures comprises forming a photoresist mask over the substrate, wherein the photoresist mask forms the sacrificial structures.

18. The method, as recited in claim 14, wherein the providing sacrificial structures comprises:
forming a sacrificial layer over the substrate,
forming a mask over the substrate;
etching features into the sacrificial layer through the mask; and
removing the mask.

19. The method, as recited in claim 18, wherein the mask is a photoresist mask.

* * * * *